(12) United States Patent
Hergenhan et al.

(10) Patent No.: US 7,649,187 B2
(45) Date of Patent: Jan. 19, 2010

(54) ARRANGEMENT FOR THE GENERATION OF EXTREME ULTRAVIOLET RADIATION BY MEANS OF ELECTRIC DISCHARGE AT ELECTRODES WHICH CAN BE REGENERATED

(75) Inventors: Guido Hergenhan, Grossloebichau (DE); Christian Ziener, Jena (DE); Frank Flohrer, Jena (DE)

(73) Assignee: XTREME Technologies GmbH, Jena (DE)

( * ) Notice: Subject to any disclaimer, the term of this patent is extended or adjusted under 35 U.S.C. 154(b) by 200 days.

(21) Appl. No.: 11/756,026

(22) Filed: May 31, 2007

(65) Prior Publication Data

US 2008/0006783 A1 Jan. 10, 2008

(30) Foreign Application Priority Data

Jun. 13, 2006 (DE) .................. 10 2006 027 856

(51) Int. Cl.
*H05G 2/00* (2006.01)
(52) U.S. Cl. .................. 250/504 R; 250/423 R; 250/428; 250/492.1; 250/493.1; 313/150; 313/163; 313/165; 313/170; 313/172
(58) Field of Classification Search ........... 250/423 R, 250/428, 492.1, 493.1, 504 R; 313/150, 313/163, 165, 170, 171, 172
See application file for complete search history.

(56) References Cited

U.S. PATENT DOCUMENTS 3,579,377 A * 5/1971 Ohmann .................. 427/120

(Continued)

FOREIGN PATENT DOCUMENTS

DE 103 42 239.0 9/2003

(Continued)

OTHER PUBLICATIONS http://www.stahl-info.de:"Schmelztauchveredeltes Band und Blech", b).

(Continued)

*Primary Examiner*—David A Vanore
*Assistant Examiner*—Michael Maskell
(74) *Attorney, Agent, or Firm*—Reed Smith LLP

(57) ABSTRACT

The invention is directed to an arrangement for generating extreme ultraviolet (EUV) radiation based on a plasma that is generated by electric discharge. It is the object of the invention to provide a novel possibility for radiation sources based on an electric discharge by which a long lifetime of the electrodes that are employed and the largest possible solid angle for bundling the radiation emitted from the plasma are achieved. According to the invention, this object is met by providing coated electrodes in the form of two endless strip electrodes which circulate over guide rollers and which have at a short distance between them an area in which the electric discharge takes place. The coating is at least partially sacrificed through excitation by an energy beam and generation of plasma, and means for driving each strip electrode are arranged in such a way that during a revolution the strip electrodes, after immersion in a molten metal, are guided through a wiper for generating a defined thickness of coating material, are directed in a vacuum chamber to a location where the desired generation of plasma takes place, and are guided back into the molten metal after the electric discharge in order to regenerate the coating and to make electric contact between the electrodes and a pulsed high-voltage source.

29 Claims, 5 Drawing Sheets

U.S. PATENT DOCUMENTS

| | | |
|---|---|---|
| 6,320,937 B1 | 11/2001 | Mochizuki |
| 2002/0070353 A1* | 6/2002 | Richardson .............. 250/492.1 |
| 2007/0085044 A1* | 4/2007 | Hergenhan et al. ...... 250/504 R |
| 2007/0152175 A1* | 7/2007 | Moors et al. ............. 250/493.1 |
| 2008/0006783 A1* | 1/2008 | Hergenhan et al. ...... 250/504 R |
| 2008/0137050 A1* | 6/2008 | Ivanov et al. .................. 355/53 |
| 2008/0277599 A1* | 11/2008 | Soer et al. .............. 250/492.22 |

FOREIGN PATENT DOCUMENTS

| | | |
|---|---|---|
| DE | 10 2005 030 304 | 6/2005 |
| WO | 2005025280 | 3/2005 |
| WO | 2005/101924 | 10/2005 |

OTHER PUBLICATIONS http://www.feuerverzinken.com/: "Fachinfo, Arbeitsblätter, Feuerverzinken, 1.1. Korrosionsschutz mit Zink").

www.prymetall.com, Prymetall GmbH & Co. KG, company brochure OV_SN_0511_D: "Verzinnte Bänder ihre Eigenschaften und Anwendungen").

* cited by examiner

ARRANGEMENT FOR THE GENERATION OF EXTREME ULTRAVIOLET RADIATION BY MEANS OF ELECTRIC DISCHARGE AT ELECTRODES WHICH CAN BE REGENERATED

CROSS-REFERENCE TO RELATED APPLICATIONS

This application claims priority of German Application No. 10 2006 027 856.9, filed Jun. 13, 2006, the complete disclosure of which is hereby incorporated by reference.

BACKGROUND OF THE INVENTION a) Field of the Invention

The invention is directed to an arrangement for generating extreme ultraviolet (EUV) radiation based on a plasma that is generated by electric discharge in which electrodes are coated with a coating material which is at least partially sacrificed in the local evaporation of emitter material induced by an energy beam and subsequent generation of plasma by electric discharge between the electrodes and which can be renewed by a continual movement of the electrodes in that a vessel containing a molten metal for regenerating the coating and for electrically contacting the electrodes with a pulsed high-voltage source is provided for each electrode. The invention is provided particularly for the production of long-lasting EUV radiation sources for semiconductor lithography.

b) Description of the Related Art

A method known from the prior art and described, e.g., in WO 2005/025280 (DE 103 42 239 A1) uses rotating disk electrodes. The electrodes are immersed peripherally in a bath of molten metal emitter material so that they are wetted in continuous rotation and a thin film of the molten metal adheres to them. A portion of the molten metal film is evaporated by a laser beam for subsequent ignition of the electric discharge, wherein additional portions of the molten metal film are evaporated or expelled as melt. For this reason, the molten metal film can be referred to as a sacrificial layer on the electrodes.

This regenerative application of molten metal ensures substantially identical evaporation conditions for each laser pulse, but has the following disadvantages:

(a) Due to the fact that the disk electrodes are arranged close together, a large portion of the energy emitted by the plasma as electromagnetic radiation and particle radiation is absorbed in comparatively small volumes of the electrodes so that these electrodes are heated to a considerable degree.

(b) Owing to the short dwell period of the electrodes in the molten metal, the cooling of the electrodes in the melt is insufficient so that an additional liquid cooling is required in the interior of the electrodes, for which purpose vacuum feedthroughs which have only a limited lifetime must be used for supporting and driving the rotary electrodes.

(c) A combination of rotary electrodes with injection of liquid or solid material into the discharge zone for a mass-limited supply of emitter material (described, e.g., in DE 10 2005 030 304 A1 which was not previously published) is only possible by means of a tangential trajectory because of the narrow gap between the closely adjacent disk electrodes so that the resulting long route is detrimental to a good pulse-to-pulse stability.

(d) Due to the geometric boundary conditions, only multiply nested reflection optics with grazing beam incidence can be used to bundle the radiation emitted from the plasma, which sharply limits the usable solid angle of the emitted radiation.

OBJECT AND SUMMARY OF THE INVENTION

It is the primary object of the invention to provide a novel possibility for an EUV radiation source based on an electric discharge by which a long lifetime of the electrodes that are employed and the largest possible solid angle for bundling the radiation emitted from the plasma are achieved.

In an arrangement for generating extreme ultraviolet (EUV) radiation based on a plasma that is generated by electric discharge in which electrodes are coated with a coating material which is at least partially sacrificed in the local evaporation of emitter material induced by an energy beam and subsequent generation of plasma by electric discharge between the electrodes and which can be renewed by a continual movement of the electrodes in that a vessel containing a molten metal of coating material for regenerating the coating and for electrically contacting the electrodes with a pulsed high-voltage source is provided for each electrode, the above-stated object is met, according to the invention, in that the electrodes are arranged in the form of two strip electrodes circulating endlessly over guide rollers and have an area at a short distance from one another in which the electric discharge for generating the plasma is provided, in that every strip electrode is guided by at least one guide roller in the vessel filled with the molten metal, wherein the respective strip electrode is immersed in the molten metal by a substantially extended portion of its length and after exiting the molten metal is guided through a wiper to generate a defined thickness of the coating material on the strip electrode, and in that means are provided for driving each strip electrode, wherein during its revolution the strip electrode is immersed in the vessel containing molten metal, passes a location in a vacuum chamber where the desired generation of plasma takes place, and is guided back into the vessel containing the molten metal after the electric discharge.

The strip electrodes are advantageously formed as endless flat bands with a narrow width or as endless round wires. However, they can also be formed as endless extruded sections having a small cross-sectional area and any convex cross-sectional shape. Tool steels or two-component materials such as cobalt molybdenum steel, which are also used for high-power band saws, can also advantageously be used as the substrate material of the strip electrodes. For the required layer of coating material, it may be necessary to provide the substrate material of the strip electrodes with a surface that can be wetted by the coating material.

Metals with a low melting temperature, preferably zinc or tin or compounds or alloys of these metals, are advisably used as coating material.

When the coating material is provided as emitter material at the same time, tin or a tin compound or tin alloy is preferably used. When emitter material is heated separately in the form of droplets or globules by energy beam ionization and subsequent spark discharge to plasma temperatures at which radiation in the desired spectral region is emitted, any other coating materials, preferably low-melting metals, electrically conductive compounds or alloys thereof can be used for the strip electrodes. In this case, the emitter material can also be non-metallic (e.g., xenon).

In order to lengthen the path along which the strip electrode travels in the vessel containing the molten metal, guide rollers are advantageously arranged for guiding the strip electrodes along a zigzag path, chiefly in order to improve the cooling of the strip electrode that is heated by the plasma. The cooling can be efficiently adjusted in a particularly simple manner because the dwell time of the strip electrodes in the molten metal through the length of the vessel and a lengthening of the travel path can be adjusted by a zigzag arrangement of the guide rollers. Further, smaller amounts of heat are absorbed from the plasma by the strip electrodes in any case due to the smaller geometric absorption surface. Therefore, the majority of the heat occurring in the plasma can be guided off to a greater distance (e.g., at the walls of the vacuum chamber) at lower power densities.

Cooling arrangements can also advantageously be arranged downstream of the vessel containing the molten metal for additional cooling of the strip electrodes.

In an advantageous manner, at least one guide roller is mounted, preferably flexibly, in an adjustable manner as a tensioning roller for tensioning the strip electrodes.

The driving of the strip electrodes can be carried out by means of a rotary drive unit at a guide roller. The transmission of rotational movement, which is advantageously generated outside of the vacuum chamber, to the guide roller located in the vacuum chamber by means of a motor can be realized without wear by a magnetic coupling.

The guide rollers of a strip electrode are advantageously arranged in such a way that the strip electrode circulates in an individual plane.

In an advantageous first variant, each of the strip electrodes is arranged in a plane coinciding with the plane of the other strip electrode, wherein the strip electrodes have a very short distance from one another that defines the location of the desired plasma generation in an area of the vacuum chamber through oppositely located guide rollers.

In a second variant, the strip electrodes are arranged in a plane which coincides with the plane of the other strip electrode, wherein the strip electrodes are oriented parallel to one another by a short distance in a defined portion in the vacuum chamber, and the location of the desired plasma generation is defined in that the electric discharge can be initiated in a deliberate manner by local introduction of energy as the result of an evaporation and preionization of emitter material. Accordingly, the location of the plasma can be selected so as to be at a distance from the guide rollers.

In a third preferred variant, each of the strip electrodes is arranged in a plane that differs from the plane of the other strip electrode so that portions of the strip electrodes are oriented askew to one another at the location of the desired plasma generation and have a point of least distance.

In order to adjust a stable location of the plasma, it is advantageous to direct an energy beam for the evaporation (preionization) of emitter material to the desired location of plasma generation between the two strip electrodes so that an area of higher conductivity results in locally limited discharge and plasma formation between the two strip electrodes by means of the preionization of emitter material.

In this connection, in a first variant, the energy beam can be directed to the coating material of the strip electrode at the desired location of plasma generation, wherein a metal emitter material which emits efficiently in the desired EUV range is used as coating material. The strip electrodes are preferably coated with tin or a tin-containing compound or alloy.

In a second variant, the energy beam is directed to a droplet flow of emitter material at the desired location of the plasma generation between the two strip electrodes, wherein a (mass-limited) droplet is evaporated (preionized) in order to generate the luminous plasma by means of electric discharge. The droplet flow can advantageously comprise liquefied xenon, tin, tin compounds, or tin alloys.

The low space requirement of the electrodes around the discharge zone makes possible almost any positioning of the nozzle for introducing additional emitter material in the form of droplets. Because of the geometric free spaces, the distance between the nozzle and the plasma can be selected in such a way that a satisfactory pulse-to-pulse stability of the radiation source and adequate protection of the nozzle from erosion are ensured due to the positioning accuracy of the droplets at the location of the plasma.

In an advantageous third variant, the energy beam at the desired location of plasma generation between the two strip electrodes is directed to a droplet flow of metal emitter material, wherein a droplet is evaporated and the emitter material is used at the same time as coating material for the strip electrodes. Tin or a tin-containing compound or alloy is preferably used as emitter material.

A laser beam, an electron beam or an ion beam can be used as energy beam.

The invention makes it possible to realize an EUV radiation source based on an electric discharge which guarantees a long lifetime of the electrodes and in which the radiation emitted from the plasma is usable from a considerably larger solid angle compared to rotary electrodes (less geometric shadowing).

The long lifetime of the electrodes is due on the one hand to the layer which can be regeneratively applied by a coating technology that has been well tested in industry and, on the other hand, to the simple and efficient external cooling (without separate cooling liquid and vacuum feedthroughs for internal cooling).

Further, due to the reduced geometric shadowing, collectors with an almost perpendicular beam incidence can also be used so that a greater collection efficiency (factor of 2) is possible.

In contrast to the known problems with rotary electrodes in which ionized tin vapor or ionized buffer gas leads to unwanted parasitic discharges, gaseous charged clouds of this kind in the invention can escape more quickly from the region of the portions of the electrode relevant for the discharge because there is no electrode gap which limits over a large area.

The invention will be described more fully in the following with reference to embodiment examples.

DESCRIPTION OF THE PREFERRED EMBODIMENTS

Figure 1:
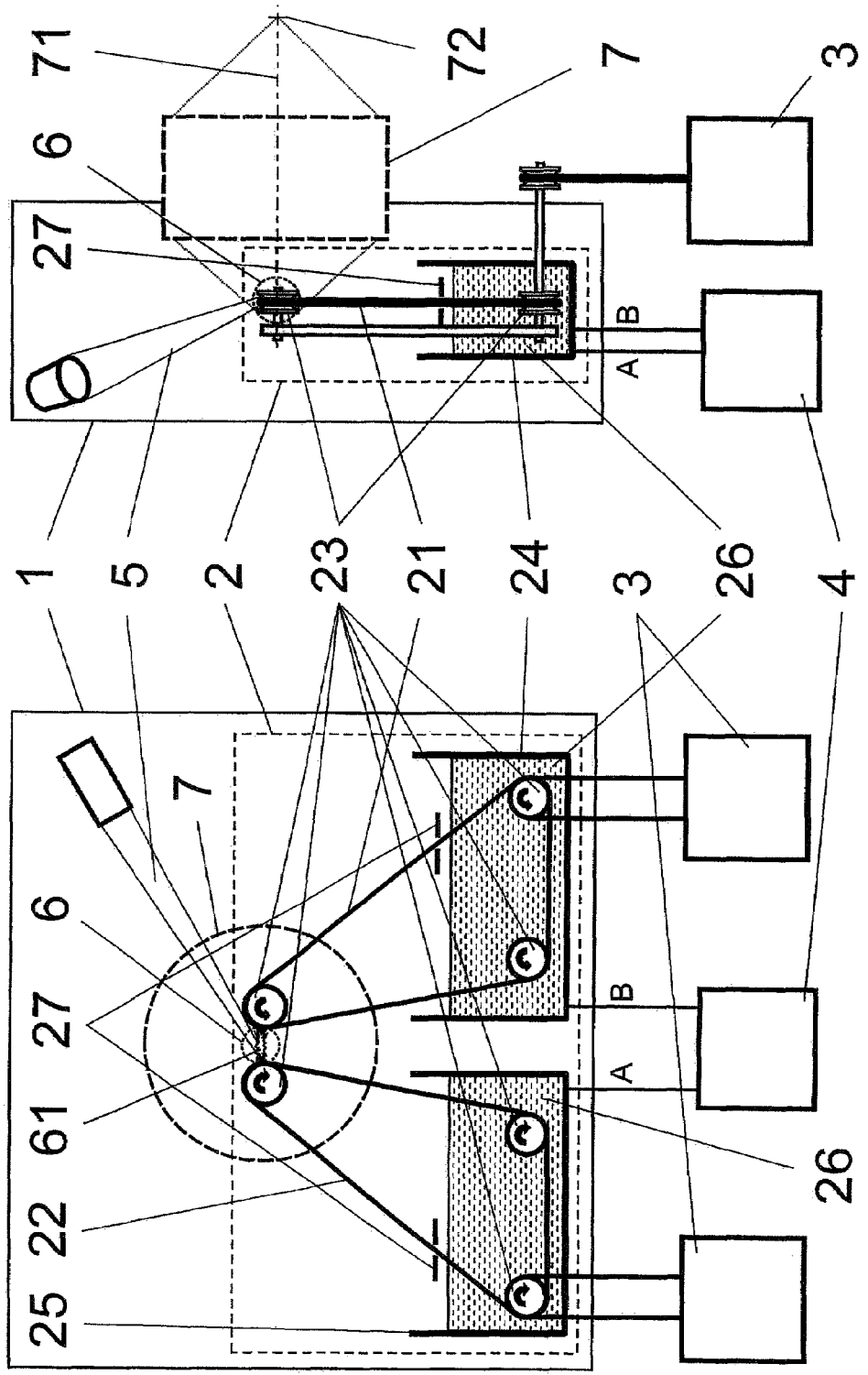
FIG. 1 is a schematic view of the arrangement according to the invention with electrodes in the form of circulating endless bands.

As is shown in the schematic view in FIG. 1, the basic arrangement of the invention for the generation of a spark plasma as radiation source comprises an electrode unit 2 which is arranged in a vacuum chamber 1 and which has two endlessly circulating strip electrodes 21 and 22, wherein a coating material is applied as electrically contacted molten metal 26 to the strip electrodes 21 and 22 and an emitter material is evaporated by an energy beam 5 at a location for the desired generation of plasma 6 in order to generate a defined hot plasma through an electric discharge 61 between the strip electrodes 21 and 22.

By strip electrodes 21 and 22 is meant in the following—without limiting generality—two endlessly circulating flat bands, round wires or profiled wires from whose surface a certain amount of coating material is evaporated (sacrificed) during every discharge process. In order to realize a long electrode life in the environment of the plasma, the evaporated coating material, as sacrificed layer, is constantly refreshed on the strip electrodes in a continuous process.

The process by which the coating is carried out is a conventional method such as is known, for example, from the industrial method of hot-galvanizing or hot-tinning for producing refined metal endless sections (e.g., wires and extruded sections) as well as for the production of so-called tin sheet for canned goods and beverage cans (source reference: a) http://www.stahl-info.de:"Schmelztauchveredeltes Band und Blech", b) http://www.feuerverzinken.com/: "Fachinfo, Arbeitsblätter, Feuerverzinken, 1.1. Korrosionsschutz mit Zink"). In hot-tinning, in a completely analogous manner, a continuously produced material section is guided through molten tin (see, e.g., www.prymetall.com, Prymetall GmbH & Co. KG, company brochure OV_SN_0511_D: "Verzinnte Bänder ihre Eigenschaften und Anwendungen"). In both methods, the desired layer thickness, usually ranging from 0.8 μm to 16 μm, is adjusted subsequently by means of special wipers.

The molten metal 26 (preferably a pure tin bath) in which a circulating strip electrode 21 or 22 immerses after passing the location of plasma generation 6 serves not only to coat the electrodes but at the same time to establish contact with the discharge circuit of a high-voltage pulse generator 4 and to cool the electrodes. The strip electrodes 21 and 22 are set in circulating motion by a drive unit 3, and each strip electrode 21 and 22 immerses in the molten metal 26 after the location of plasma generation 6, passes through a wiping device 27 (preferably with mechanical wipers or gas jets) after exiting from the molten metal 26, and is then returned to the location of plasma generation 6.

Even at high circulating speeds of the strip electrode 21, 22 of several meters per second—in contrast to rotating disk electrodes—the dwell time of the strip in the molten metal 26 can be adjusted in almost any desired manner for optimal cooling. In case the geometric length of the vessels 24 or 25 is not sufficient for cooling in the molten metal 26, the path of the strip electrode 21 or 22 (and therefore the duration of its immersion) can be prolonged by a plurality of deflecting guide rollers 23 in the vessel 24 and 25, respectively (as compactly as possible).

A location in the vacuum chamber 1 where the strip electrodes 21 and 22 are at the shortest distance from one another is selected as the location of plasma generation 6 where emitter material is evaporated by an energy beam 5 to increase the conductivity in the desired area. An electric discharge 61 is then ignited in the conductive channel that is produced in this way between the strip electrodes 21 and 22 by the pulse generator 4 which is connected to the vessels 24 and 25 and a hot radiating plasma is generated. The radiation emitted by the plasma is projected in an intermediate focus 72 by collector optics 7 along their optical axis 71 and this conjugate source location is used as a radiation source for specific illumination tasks.

Figure 2:
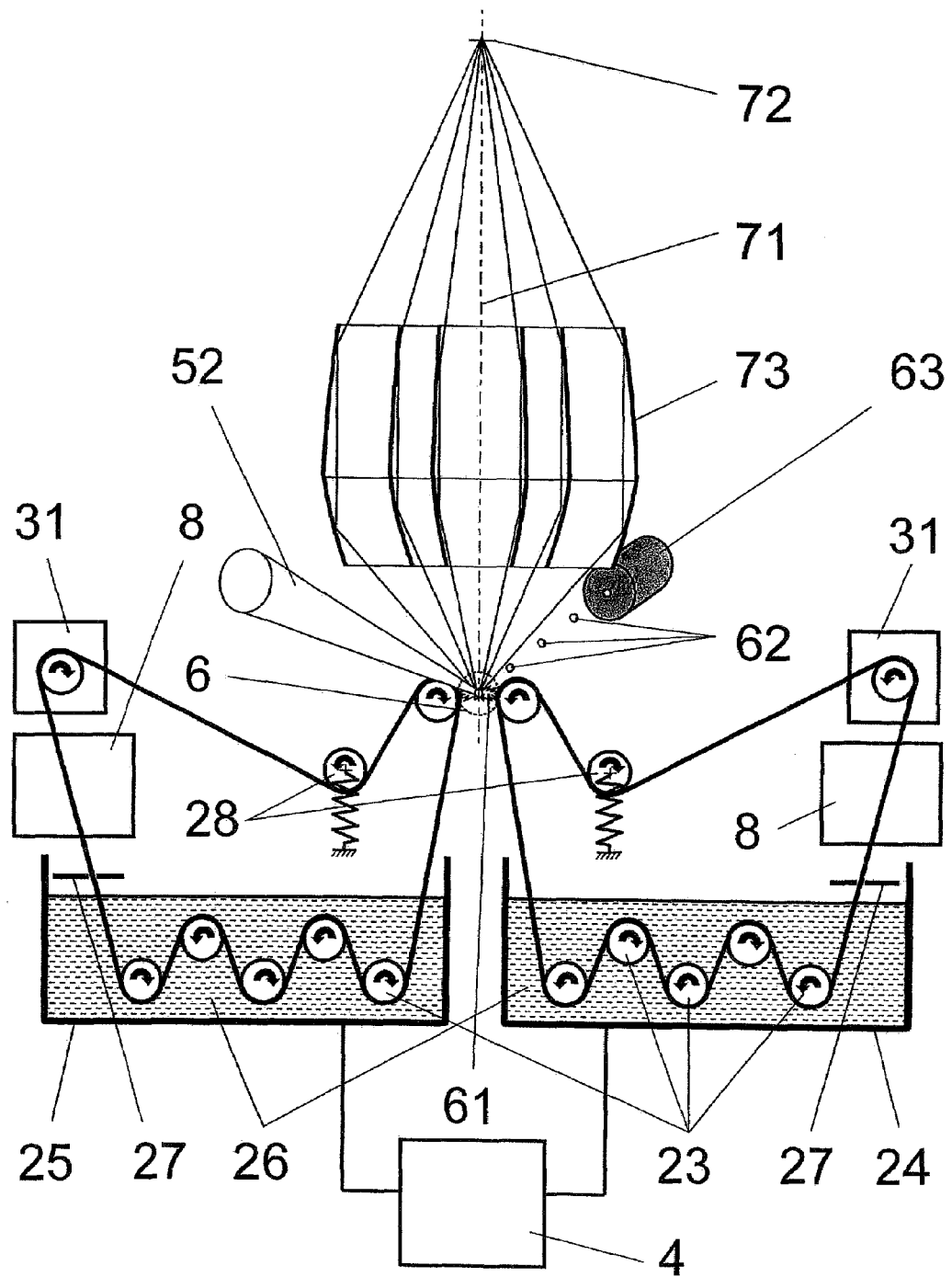
FIG. 2 shows a variant with injection and laser excitation of emitter material for specifying a defined location of plasma generation.

In an advantageous construction shown in FIG. 2, the location of plasma generation 6 is defined by the evaporation of individual droplets of a droplet flow 62 of emitter material (e.g., xenon or tin) which is supplied from a droplet generator 63 in that a pulsed laser beam 52 evaporates the emitter material between the strip electrodes 21 and 22 before the electric discharge 61 is ignited. The laser 51 is triggered at the pulse frequency of the pulse generator 4. Ideally, the droplet generator 63 also supplies the series of droplets 62 at the same frequency. By means of a configuration of this kind, only as much emitter material as can be evaporated is supplied in the vacuum chamber 1 so that the conductivity of the residual gas in the vacuum is increased cyclically only at the location of the desired plasma generation 6 that is predetermined in this way.

Referring to FIG. 2, the strip electrodes 21 and 22 are guided through the molten metal 26 by a plurality of deflecting guide rollers 23 (e.g., five arranged in a plane) in order to hold the strip electrodes 21 and 22 to the longest possible path (and therefore for a long period of time) in the molten metal 26 when the dimensions of the vessels 24 and 25 are limited. In this way, on the one hand, cooling is improved following the thermal action at the location of plasma generation 6 and, on the other hand, the pulse generator 4 makes reliable contact with the strip electrodes 21 and 22 by means of the vessels 24 and 25. The strip electrodes 21 and 22 need not necessarily be guided in an individual plane as was mentioned above. In certain cases, it may be useful to guide the guide rollers 23 (e.g., for lengthening their running path) in the molten metal 26 in a plurality of different planes in order to limit the height or volume of the vessels 24 and 25 as much as possible.

Further, referring to FIG. 2, a cooling unit 8 (with crosswise gas flows or cooling chambers) is provided for each strip electrode 21 and 22 for additional cooling after exiting from the molten metal 26.

The circulation of the strip electrodes 21 and 22 is carried out by means of a rotary drive unit 31 acting at one of the guide rollers 23. One guide roller 23 is constructed as a movably mounted tensioning roller 28 to prevent slippage of the strip electrodes 21 and 22.

Further, dish-shaped optics 73 for grazing beam incidence in which a plurality of metal mirror dishes are nested coaxially one inside the other are used as collector optics 7 for collecting the radiation emitted from the plasma. In this way, the location of plasma generation 6 is imaged in an intermediate focus 72.

Figure 3:
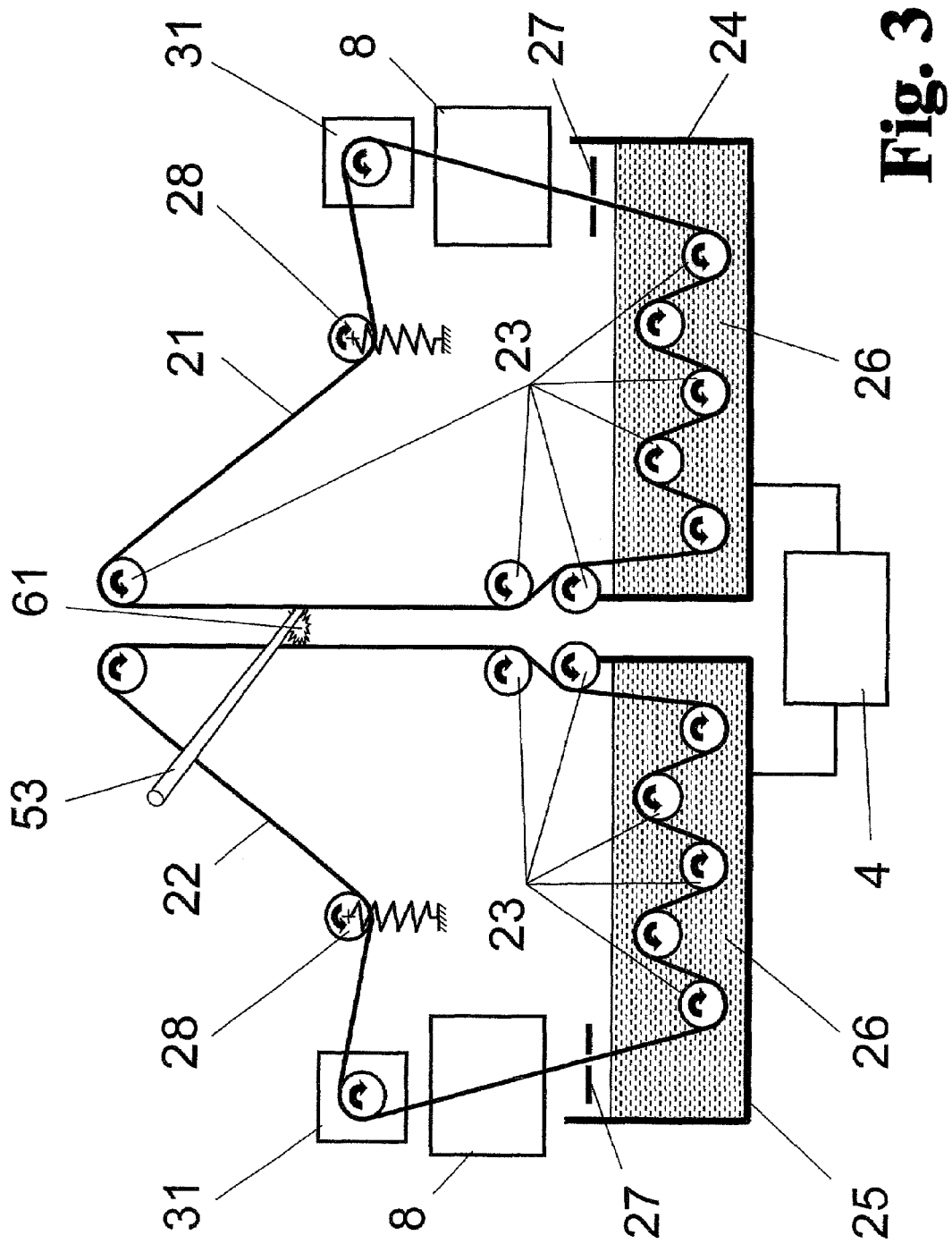
FIG. 3 shows a modified variant referring to FIG. 2, in which the coating material is also the emitter material and the location of plasma generation has been distanced from the area of the guide rollers of the strip electrodes through the evaporation of coating material in the area of strip portions running between the rollers.

To reduce thermal stress on the guide rollers 23, FIG. 3 shows an embodiment form in which an electron beam 53 initiates the plasma in the vacuum chamber 1 in an area that does not contact a guide roller 23 of the strip electrode 21, 22. In this example, the evaporation of emitter material is carried out by means of an electron beam 53 which is directed to the surface of one of the strip electrodes 21 or 22 to evaporate the coating material of tin (which is also used as emitter material). The evaporation of the tin layer from one of the surfaces of the strip electrodes 21 and 22 by the electron beam 53 serves to define the desired location of plasma generation 6 in which the electric discharge 61 is ignited in a reproducible manner.

In this example, the portions of the strip electrodes 21 and 22 having the shortest distance from one another are parallel to one another so that the evaporation of the tin is the only step for dictating the location of the electric discharge 61. However, because of the parallel guiding of the strip electrodes 21 and 22 between two oppositely running pairs of guide rollers, the high thermal load occurring as a result of the generation of plasma can be kept away from the guide rollers so that the latter need not be cooled additionally. All the rest of the elements such as, e.g., the tensioning rollers 28, additional cooling arrangement 8, and the plurality of guide rollers inside the vessels 24 and 25 for the tin melt 26 are realized in exactly the same way as in FIG. 2. Also, the construction of the drive unit for the strip electrodes 21 and 22 at a guide roller 23 in the vacuum chamber 1 is realized in the same way as in FIG. 2. In this case, the rotational movement is generated by a motor preferably outside the vacuum chamber and is transmitted to the guide roller 23 located in the vacuum chamber 1 in a vacuum-tight manner and with low wear by means of a magnetic coupling (not shown).

Figure 4:
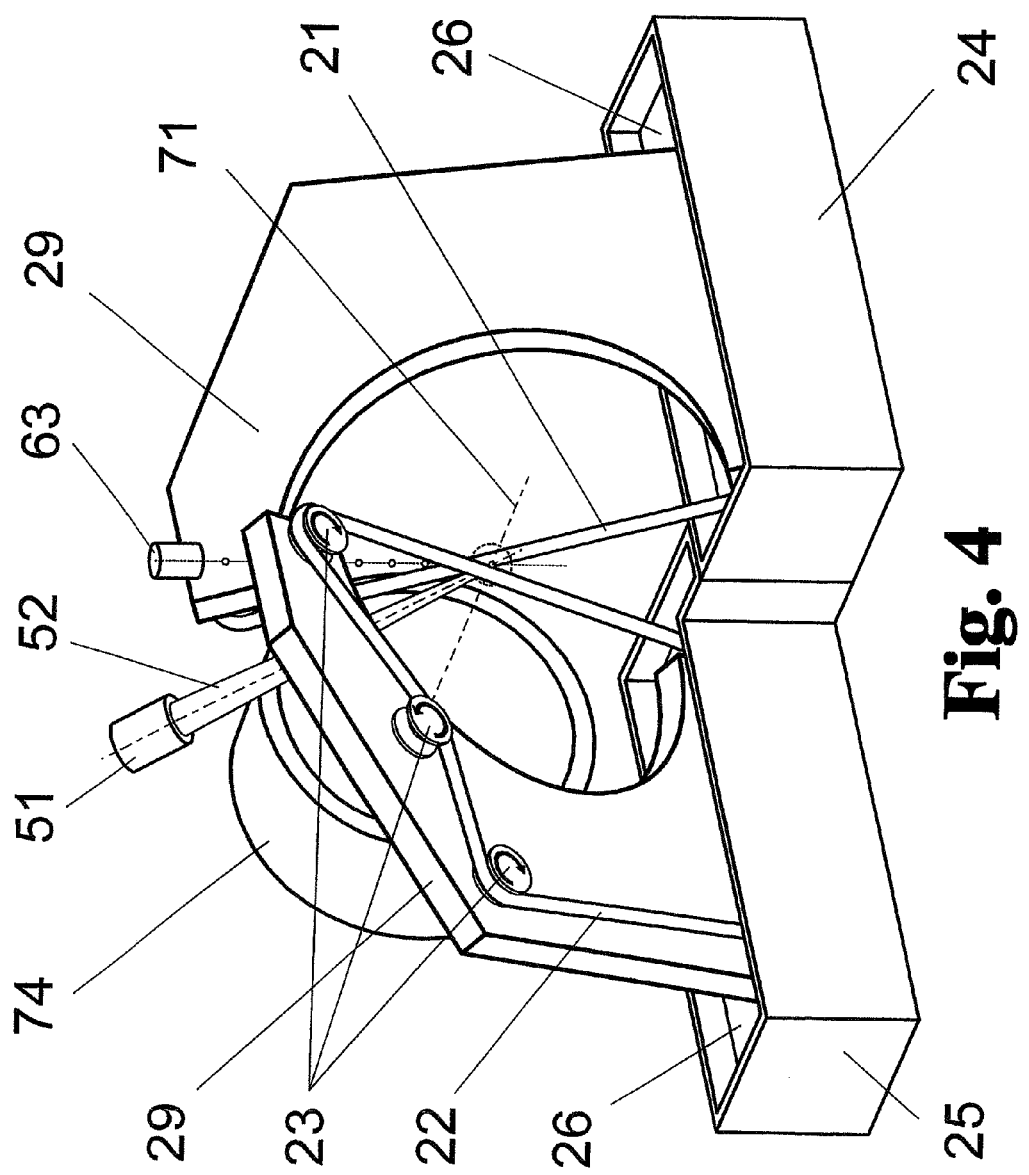
FIG. 4 shows a perspective view of a variant in which the strip electrodes circulate in two planes that intersect one another, wherein the strip electrodes run in the area of plasma formation on straight lines which are oriented geometrically askew to one another and the plasma is generated in the area of the least distance.

FIG. 4 shows a construction of the EUV source in which the strip electrodes 21 and 22 are disposed at an inclination to one another in their respective vessels 24 and 25. In this example, the coating material is efficient emitter material (e.g., pure tin) which is applied to the strip electrodes 21 and 22 in the manner of hot-galvanizing. In addition, droplets of the same emitter material (tin) are directed to the location of desired plasma generation and are evaporated by a laser beam 52. The subsequent electric discharge 61 ignites the radiation-emitting plasma whose radiation yield is further improved by the electrode coating of emitter material.

The planes in which the strip electrodes 21 and 22 extend (at least at the location of plasma generation 6 inside the vacuum chamber 1) intersect one another in a straight line that runs substantially parallel to the surface of the tin melt 26. The guide plates 29 used for holding the guide rollers 23 are inclined at the same angle to one another. Accordingly, the portions of the strip electrodes 21 and 22 which are located between two guide rollers 23 and between which the electric discharge 61 must take place are oriented geometrically askew to one another and have the shortest distance from one another at the desired location of plasma generation 6. This shortest distance preferably lies approximately in the middle between the final guide roller 23 before the location of plasma generation 6 and the immersion point in the tin melt 26. At this location, the electric discharge 61 is initiated by the immediately preceding laser evaporation of a tin droplet from the droplet flow 62 introduced between the strip electrodes 21 and 22 so that the plasma is formed in the discharge gap.

The droplets of the droplet flow 62 are generated by a droplet generator 63 which is arranged in such a way that the droplet flow 62 is directed in one of the two vessels 24 or 25 to recycle emitter material that is not evaporated.

Further, FIG. 4 shows collector optics 7 in the form of reflecting alternating layer optics 74 (multilayer mirror optics) in which the radiation emitted by the plasma is collected with an almost perpendicular beam incidence and focused in an intermediate focus 72. The optical axis 71 of the collector optics 7 extends through the desired location of plasma generation 6 and is so directed that the strip electrodes 21 and 22 remaining exclusively in the beam path (because all of the other elements according to the invention are shifted far outward) cast the smallest possible shadow when the plasma is projected by the collector optics 7.

The use of collector optics 7 of this kind (preferably constructed as a Mo/Si alternating layer system) is especially advantageous in this construction according to FIG. 4 when the two strip electrodes 21 and 22 are narrow and run askew to one another in the area of the electric discharge 61 so that they cast only a very slight shadow over the entire solid angle of $4\pi$.

Figure 5:
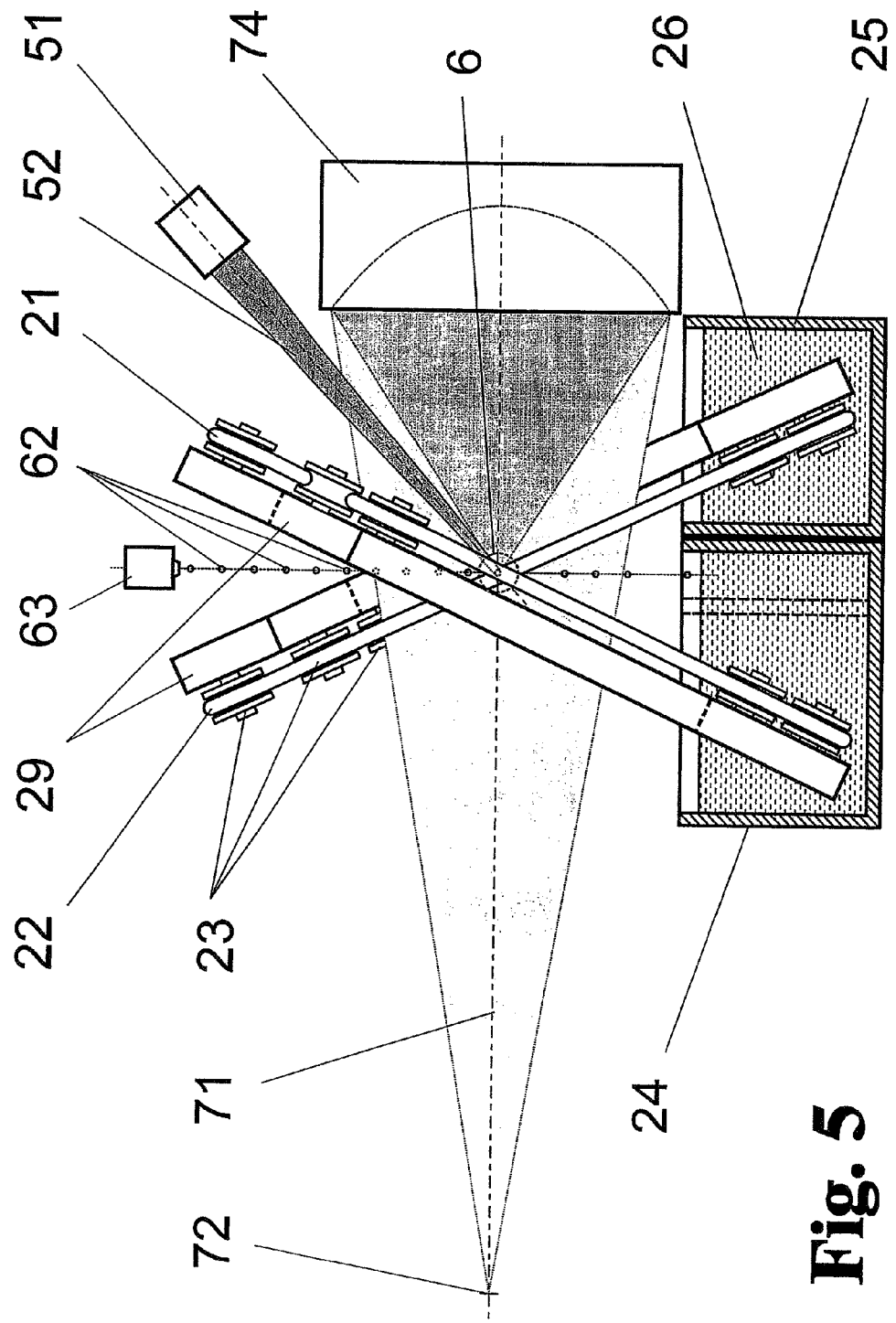
FIG. 5 is a side view referring to FIG. 4 with the viewing direction along the sectional straight lines of the planes of the two circulating strip electrodes, wherein the incident and reflected beam bundles are shown symbolically for the collector optics with an almost perpendicular beam incidence.

FIG. 5 shows a side view of the arrangement described in FIG. 4 with alternating layer optics 74 which reflect almost perpendicularly. In FIG. 4, the selected viewing direction is from the rear right-hand side along the section line of the planes of the guide plates 29 at which the strip electrodes 21 and 22 circulate.

The selected inclined position of the guide plates 29, and also the guide rollers 23 which are located inside the tin melt 26 and which lengthen the running path of the strip electrodes 21 and 22 in their respective vessels 24 and 25 by guiding them in a zigzagging path, can be seen more clearly through the vessels 24 and 25 for the tin melt 26 which are shown in section and which communicate with different poles of the pulse generator 4 (shown only in FIGS. 1 to 3). The wipers 27 were not shown in the drawing for the sake of clarity. They are arranged analogous to FIGS. 1 to 3.

In contrast to FIG. 4, FIG. 5 further shows the beam cone of the beam bundle that is acquired by the alternating layer optics 74 and reflected to the intermediate focus 72. All of the other spatial position relationships and operations are the same as those described with reference to FIG. 4 and can be gathered therefrom.

While the foregoing description and drawings represent the present invention, it will be obvious to those skilled in the art that various changes may be made therein without departing from the true spirit and scope of the present invention.

REFERENCE NUMBERS

1 vacuum chamber
2 electrode unit
21 first strip electrode
22 second strip electrode
23 guide rollers
24 first vessel (for molten metal)
25 second vessel (for the molten metal)
26 molten metal/tin melt
27 wiper
28 tensioning roller
29 guide plate
3 drive unit
31 rotary drive unit
4 pulse generator
5 energy beam
51 laser
52 laser beam
53 electron beam
6 location of plasma generation
61 (electric) discharge
62 droplet flow
63 droplet generator
7 collector optics
71 optical axis
72 intermediate focus
73 dish-shaped optics (for grazing beam incidence)
74 alternating layer optics
8 cooling arrangement

What is claimed is:

1. An arrangement for generating extreme ultraviolet radiation based on a plasma that is generated by electric discharge in which electrodes are coated with a coating material which is at least partially sacrificed in the local evaporation of emitter material induced by an energy beam and subsequent generation of plasma by electric discharge between the electrodes and which can be renewed by a continual movement of the electrodes comprising:

a vessel containing a molten metal of coating material for regenerating the coating and for electrically contacting the electrodes with a pulsed high-voltage source provided for each electrode;

said electrodes being arranged in the form of two strip electrodes circulating endlessly over guide rollers and having an area at a short distance from one another in which the electric discharge for generating the plasma is provided;

every strip electrode being guided over at least one guide roller in the vessel filled with the molten metal;

said respective strip electrode being immersed in the molten metal by a substantially extended portion of its length and after exiting from the molten metal being guided through a wiper to generate a defined thickness of the coating material on the strip electrode;

means being provided for driving each strip electrode; and wherein during its revolution the strip electrode is immersed in the vessel containing molten metal, passes a location in a vacuum chamber where the desired generation of plasma takes place, and is guided back into the vessel containing the molten metal after the electric discharge.

2. The arrangement according to Claim 1;
wherein the strip electrodes are formed as endless flat bands with a narrow width.

3. The arrangement according to Claim 1;
wherein the strip electrodes are formed as endless round wires.

4. The arrangement according to Claim 1;
wherein the strip electrodes are formed as endless extruded sections having a small cross-sectional area and any convex cross-sectional shape.

5. The arrangement according to Claim 1;
wherein pure tin is provided as coating material.

6. The arrangement according to Claim 1;
wherein tin compounds or tin alloys are provided as coating material.

7. The arrangement according to Claim 1;
wherein pure zinc is provided as coating material.

8. The arrangement according to Claim 1;
wherein zinc compounds or zinc alloys are provided as coating material.

9. The arrangement according to Claim 1;
wherein guide rollers are provided for guiding the strip electrode in order to lengthen the path along which the strip electrode travels in the vessel containing the molten metal.

10. The arrangement according to Claim 1;
wherein at least three guide rollers are provided for guiding the strip electrode along a zigzag path in order to lengthen the path along which the strip electrode travels in the vessel containing the molten metal.

11. The arrangement according to Claim 1;
wherein a cooling arrangement is arranged downstream of the vessel containing the molten metal for additional cooling of the strip electrode.

12. The arrangement according to Claim 1;
wherein at least one guide roller is mounted in an adjustable manner as a tensioning roller for tensioning the strip electrode.

13. The arrangement according to Claim 1;
wherein the strip electrodes are driven by means of a rotary drive unit at a guide roller.

14. The arrangement according to Claim 1;
wherein the strip electrodes are driven by magnetic coupling.

15. The arrangement according to Claim 1;
wherein the guide rollers of a strip electrode are arranged in such a way that the strip electrode circulates in an individual plane.

16. The arrangement according to Claim 15;
wherein each of the strip electrodes is arranged in a plane coinciding with the plane of the other strip electrode; and
wherein the strip electrodes have a very short distance from one another that defines the location of the desired plasma generation in an area of the vacuum chamber through oppositely located guide rollers.

17. The arrangement according to Claim 15;
wherein each of the strip electrodes is arranged in a plane which coincides with the plane of the other strip electrode; and
wherein the strip electrodes are oriented parallel to one another at a short distance in a defined portion in the vacuum chamber, and the location of the desired plasma generation is defined in that the electric discharge can be initiated in a deliberate manner by local introduction of energy by means of an energy beam as a result of an evaporation and preionization of emitter material.

18. The arrangement according to Claim 15;
wherein each of the strip electrodes is arranged in a plane that differs from the plane of the other strip electrode so that portions of the strip electrodes are oriented askew to one another at the location of the desired plasma generation and have a point of least distance.

19. The arrangement according to Claim 1;
wherein an energy beam for the evaporation of emitter material is directed to the desired location of plasma generation between the two strip electrodes so that an area of higher conductivity results in locally limited discharge and plasma formation between the two strip electrodes by means of the preionization of emitter material.

20. The arrangement according to Claim 19;
wherein tin or a tin-containing compound or alloy is provided as emitter material.

21. The arrangement according to Claim 20;
wherein the energy beam at the desired location of plasma generation is directed to the coating material of the strip electrodes; and
wherein a metal emitter material is used as coating material.

22. The arrangement according to
wherein the energy beam at the desired location of plasma generation between the two strip electrodes is directed to a droplet flow of emitter material; and
wherein a droplet is evaporated in order to generate the plasma by means of the electric discharge.

23. The arrangement according to Claim 22;
wherein the droplet flow comprises xenon.

24. The arrangement according to Claim 20;
wherein the energy beam at the desired location of plasma generation between the two strip electrodes is directed to a droplet flow of emitter material; and
wherein a droplet is evaporated and the emitter material is used as a coating material for the strip electrodes at the same time.

25. The arrangement according to Claim 24;
   wherein tin or a tin-containing compound or alloy is provided as emitter material.
26. The arrangement according to Claim 19;
   wherein the energy beam is a laser beam.
27. The arrangement according to Claim 19;
   wherein the energy beam is an electron beam.
28. The arrangement according to Claim 19;
   wherein the energy beam is directed to one of the surfaces of the strip electrodes.
29. The arrangement according to Claim 19;
   wherein the energy beam is directed to an additional droplet flow of emitter material between the strip electrodes.

* * * * *